(12) United States Patent
Hirano

(10) Patent No.: US 8,901,569 B2
(45) Date of Patent: Dec. 2, 2014

(54) POWER SEMICONDUCTOR DEVICE

(75) Inventor: Hosei Hirano, Tokyo (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 177 days.

(21) Appl. No.: 13/578,842

(22) PCT Filed: Feb. 18, 2011

(86) PCT No.: PCT/JP2011/054215
§ 371 (c)(1),
(2), (4) Date: Aug. 14, 2012

(87) PCT Pub. No.: WO2011/102547
PCT Pub. Date: Aug. 25, 2011

(65) Prior Publication Data
US 2012/0305945 A1 Dec. 6, 2012

(30) Foreign Application Priority Data
Feb. 19, 2010 (JP) .................................. 2010-034284

(51) Int. Cl.
*H01L 29/15* (2006.01)
*H01L 23/00* (2006.01)

(52) U.S. Cl.
CPC ....... *H01L 24/48* (2013.01); *H01L 2924/13063* (2013.01); *H01L 2924/01019* (2013.01);
(Continued)

(58) Field of Classification Search
None
See application file for complete search history.

(56) References Cited

U.S. PATENT DOCUMENTS

2011/0193098 A1* 8/2011 Autry .............................. 257/77

FOREIGN PATENT DOCUMENTS

| JP | 50-143467 | 11/1975 |
| JP | 10-130882 | 5/1998 |

(Continued)

OTHER PUBLICATIONS

Akira Morozumi, Katsumi Yamada, Tadashi Miyasaka "Reliability Design Technology for Power Semiconductor Modules", Fuji Electric Review, vol. 74, No. 2, p. 145-148 (2001).

(Continued)

*Primary Examiner* — Yasser A Abdelaziez
(74) *Attorney, Agent, or Firm* — Kenyon & Kenyon LLP

(57) ABSTRACT

Provided is a power semiconductor device comprising a bonding joint that, even under a temperature environment of 150° C. or greater enabling operation of a wide bandgap semiconductor, reduces cracking-destruction occurring owing to thermal cycle while conductively connecting an electrode, connection terminal, and semiconductor device substrate.

It is a power semiconductor device capable of operating under a temperature of 150° C. or greater having an electrode laminated on a wide bandgap semiconductor substrate and a connection terminal joined to the electrode for connection to external wiring, which power semiconductor device is characterized in that difference among the three coefficients of linear expansion of the electrode, a core of the connection terminal, and the semiconductor device substrate is $5.2 \times 10^{-6}$/K at maximum, and that it comprises a joint that directly joins the connection terminal and the electrode.

7 Claims, 1 Drawing Sheet

(52) U.S. Cl.
CPC ........ *H01L 2924/20751* (2013.01); *H01L 2224/45144* (2013.01); H01L 24/85 (2013.01); *H01L 2924/014* (2013.01); *H01L 2224/45565* (2013.01); *H01L 2224/85205* (2013.01); *H01L 2924/0001* (2013.01); *H01L 2924/0132* (2013.01); *H01L 2924/1033* (2013.01); *H01L 2924/01042* (2013.01); *H01L 2924/01047* (2013.01); *H01L 2224/48699* (2013.01); *H01L 2924/01024* (2013.01); *H01L 2224/29111* (2013.01); *H01L 2924/10254* (2013.01); *H01L 2924/01046* (2013.01); *H01L 2224/45184* (2013.01); *H01L 2924/13091* (2013.01); *H01L 2224/4847* (2013.01); *H01L 2924/00014* (2013.01); *H01L 2924/13055* (2013.01); *H01L 2924/01078* (2013.01); *H01L 2224/73265* (2013.01); H01L 24/05 (2013.01); *H01L 2924/01014* (2013.01); *H01L 2924/01074* (2013.01); *H01L 2924/0105* (2013.01); *H01L 2224/48599* (2013.01); *H01L 2224/32225* (2013.01); *H01L 2924/01029* (2013.01); *H01L 2224/45124* (2013.01); *H01L 2924/00015* (2013.01); H01L 24/33 (2013.01); *H01L 2924/01022* (2013.01); *H01L 2924/01006* (2013.01); *H01L 2924/01028* (2013.01); *H01L 2924/01004* (2013.01); *H01L 2224/04042* (2013.01); *H01L 2924/01327* (2013.01); *H01L 2924/01082* (2013.01); *H01L 2924/01031* (2013.01); *H01L 2924/01013* (2013.01); *H01L 2224/45015* (2013.01); *H01L 2924/01033* (2013.01); *H01L 2224/48491* (2013.01); *H01L 2924/10253* (2013.01); *H01L 2224/45647* (2013.01); *H01L 2924/10272* (2013.01); *H01L 2924/01079* (2013.01)
USPC .. 257/77; 257/76; 257/E29.002; 257/E29.082

(56) References Cited

FOREIGN PATENT DOCUMENTS

| | | |
|---|---|---|
| JP | 10-199923 | 7/1998 |
| JP | 11-274215 | 10/1999 |
| JP | 2000-357705 | 12/2000 |
| JP | 2003-303845 | 10/2003 |
| JP | 2003-309142 | 10/2003 |
| JP | 2005-310844 | 11/2005 |
| JP | 2006-339174 | 12/2006 |

OTHER PUBLICATIONS

International Search Report dated Mar. 22, 2011, issued in corresponding PCT Application No. PCT/JP2011/054215.
S. Yoshida "Improvement of High Power Device Characteristics by Using Wide Bandgap Semiconductors", Bulletin of the Electrotechnical Laboratory, vol. 62 No. 10,11, p. 493-507 (1998) [with English Abstract and Partial Translation].

* cited by examiner

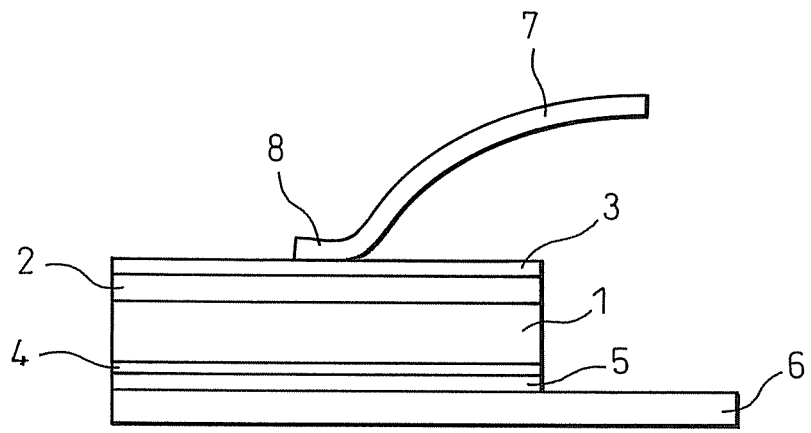
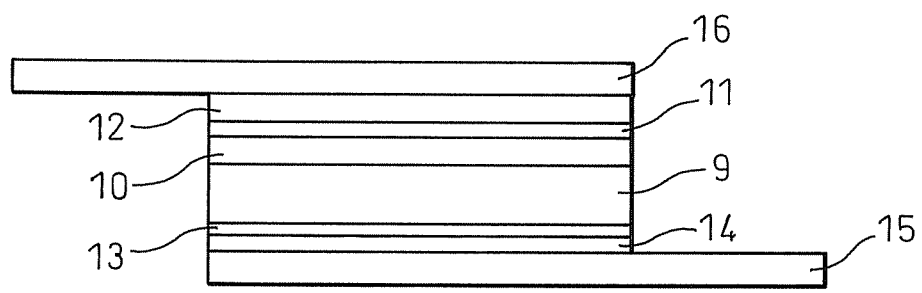

US 8,901,569 B2

POWER SEMICONDUCTOR DEVICE

This application is a national stage application of International Application No. PCT/JP2011/054215, filed Feb. 18, 2011, which claims priority to Japanese Application No. 2010-034284, filed Feb. 19, 2010, the content of which is incorporated by reference in its entirety.

TECHNICAL FIELD

This invention relates to a power semiconductor device usable under a high-temperature environment.

BACKGROUND ART

Devices used for power conversion include, among others, the diode, transistor, MOSFET and IGBT. These devices are generally formed of silicon semiconductor material. A semiconductor material subjected to various types of processing is diced by the device fabrication process to acquire a semiconductor chip with desired functions. The semiconductor chip is incorporated into a device or module by connecting electrodes formed on the semiconductor chip surface through solder to wires (bonding wires) whose other ends are connected to electrodes for external connection.

The solder used to connect the electrodes formed on the semiconductor chip surface and the wires is generally Sn/Pb based. The melting point of Sn/Pb-based solder is about 180° C. When the temperature of the solder rises to near the solder melting point, the solder may soften and make it impossible to maintain the connection between the electrodes formed on the semiconductor chip and the wires. Semiconductor devices that use Sn/Pb based solder for the connections between the electrodes formed on the surface and the wires are therefore are usually used under a temperature of around 150° C. or lower. Further, thermal cycle breakdown mode is known in semiconductors that use solder. Thermal cycle breakdown mode is a breakdown mode that occurs due to, for example, repeated current ON-OFF, even when the solder melting temperature has not been reached. Thermal cycle breakdown mode is a phenomenon in which the heat cycle generates cracks in and breaks connections by producing sheer stress at the joints between the semiconductor chip, wires and solder owing to the difference in their individual coefficients of linear expansion (see Non-patent Document 1).

Various techniques are known for increasing the reliability of connections joined by solder. Patent Document 1 teaches a technique for joining a connection terminal and a semiconductor device by using two types of solder differing in melting point. The higher melting point solder is used to establish solder thickness, and the higher melting point solder is coated with the lower melting point solder.

Further, Patent Document 2 makes known a problem in the power semiconductor module that uses a silicon semiconductor chip and aluminum wires. A silicon chip and an aluminum wire differ greatly in linear expansion rate. Therefore, when the module is heated or cooled, high thermal stress occurs at the joint interface between the wire and the pad (electrode). The wire may detach in a short time owing to repeated action of this thermal stress. And for resolving this kind of problem, a technique is taught of forming a groove in or otherwise geometrically machining the pad so as to mitigate the thermal stress occurring at the joint of the aluminum wire connected to the pad by ultrasonic wire bonding, specifically the tensile stress arising in the wire connected to the pad.

Metal wires, chiefly of gold (Au), copper (Cu), and aluminum (Al), are generally used as the wires connected to a semiconductor chip. Patent Document 3 teaches a composite metal wire material for electronic wiring used in semiconductor devices and inside electronic equipment. This composite metal wire material for electronic wiring makes it possible to ensure strength in an ultrafine wire by coating a tungsten (W) core with a copper (Cu) coating layer.

On the other hand, progress is recently being made in the development and practical application of devices that use elements of, inter alia, silicon carbide (SiC), gallium nitride (GaN) and diamond, called wide bandgap semiconductors, which, compared to conventional silicon semiconductor materials, are high in intrinsic range temperature of functioning as a semiconductor and capable of operating at high temperatures, and also high in saturation drift velocity and dielectric breakdown electric field. Experimental operation of wide bandgap semiconductors under high temperatures of 250° C. to 600° C. has been reported (Non-patent Document 2).

Use of devices made with wide bandgap semiconductors will enable device operation under high temperatures. For example, in environments exposed to high temperatures, such as outdoors or inside vehicles, devices made of wide bandgap semiconductors can be stably operated with an air-cooling or other simple cooling device. Moreover, wide bandgap semiconductors have advantages not found in conventional silicon semiconductors, including their high current density and the fact that their operation in high-frequency operation enhances maximum use temperature freedom even when device temperature becomes high. Moreover, since their high dielectric breakdown field strength enables use of schottky barrier diodes, MOSFETs and other unipolar devices in high-voltage, high-frequency switching circuits, they make size reduction of high-output power supply equipment possible among other advantages.

PRIOR ART REFERENCES

Patent Documents

Patent Document 1 Unexamined Patent Publication (Kokai) No. 2006-339174
Patent Document 2 Unexamined Patent Publication (Kokai) No. 10-199923
Patent Document 3 Unexamined Patent Publication (Kokai) No. 10-130882

Non-Patent Document

Non-patent Document 1 Akira MOROZUMI, Katsumi YAMADA, Tadashi MIYASAKA "Reliability Design Technology for Power Semiconductor Modules" Fuji Electric Review, Vol 74 No. 2 p. 145-148 (2001)
Non-patent Document 2 Sadafumi YOSHIDA "Improvement of High Power Device Characteristics by Using Wide Bandgap Semiconductors" Bulletin of the Electrotechnical Laboratory, Vol. 62 No. 10, 11 p. 493-507 (1998)

SUMMARY OF THE INVENTION

Problem to be Solved by the Invention

When a device fabricated from a wide bandgap semiconductor material is operated at high temperature, solder cannot be used for the joints that connect the wide bandgap semiconductor material and the connection terminals. This is because, as stated above, the melting point of the generally used solder is about 180° C. and this temperature is lower than the temperature at which a device fabricated from a wide bandgap semiconductor material can operate. With the Sn/Pb-based solder, for example, the solder softens and electrical connection cannot be maintained at a temperature of 150° C. or higher. Further, even in the case where a solder of some other composition system having a high melting point is used, composition systems having properties suitable as solder have melting points of 260° C. or lower. Therefore, no solder is available that can maintain electrical connection at a temperature of 260° C. or higher.

On the other hand, as a connection technique other than soldering is the one of directly pressure bonding an aluminum wire or the like on the semiconductor chip. However, since a material like aluminum wire and the semiconductor chip have different coefficients of linear expansion, the pressure bonded joint is liable to be broken by the thermal cycle. Their coefficients of linear expansion differ by an order of ten in the vicinity of room temperature. Specifically, among wide bandgap semiconductors, the coefficient of linear expansion of silicon carbide is $4.2 \times 10^{-6}$/K (a axis), the coefficient of linear expansion of GaN is $5.6 \times 10^{-6}$/K (a axis), and the coefficient of linear expansion of diamond is $1.1 \times 10^{-6}$/K. On the other hand, the coefficient of linear expansion of aluminum generally used as the bonding wire of power devices is $23 \times 10^{-6}$/K, the coefficient of linear expansion of copper is $16.8 \times 10^{-6}$/K, and the coefficient of linear expansion of gold is $14.3 \times 10^{-6}$/K. The coefficient of linear expansion of the silicon semiconductor material, currently the mainstream, is $2.4 \times 10^{-6}$/K. By optimizing the geometric structure of the pad where the aluminum wired pressure-bonded joint is formed as in Patent Document 2, for example, it has become possible to avoid problems caused by difference in coefficient of linear expansion between the silicon semiconductor material and the wires in the temperature range in which the conventional silicon semiconductor can be used. However, when a device fabricated from a wide bandgap semiconductor material is operated at high temperature, the problems caused by difference in coefficient of linear expansion between the wide bandgap semiconductor semiconductor material and the wires cannot be avoided merely by optimizing the geometric structure of the pad as mentioned above.

Patent Document 3 teaches a composite metal wire for electronic wiring which consists of a tungsten core coated with a copper coating layer. However, Patent Document 3 does not set out even a single concrete example of bonding a semiconductor material. The wire set out in Patent Document 3 is used in applications requiring ultrafine wiring. In order to impart flexibility and realize low conductor resistance, the diameter of the wire described in Patent Document 3 is 15 μm or less. The wire of Patent Document 3 therefore cannot be utilized in a device using a wide bandgap semiconductor. Particularly, the large current the wire would have to carry if used in a power semiconductor device makes use of the wire mentioned in Patent Document 3 impractical. Further, in the case of using the power semiconductor device under high temperature of 150° C. or greater, the difference in coefficient of linear expansion between the semiconductor substrate and the bonding wire might crack and break their joint.

In light of the aforesaid issues, the present invention has as its object to provide a power semiconductor device wherein a semiconductor device electrode, bonding wire and semiconductor device substrate are respectively conductively connected, which power semiconductor device comprises a bonding joint that reduces the likelihood of cracking-destruction occurring owing to thermal cycle under a temperature environment of 150° C. or greater enabling operation of a wide bandgap semiconductor and causing conventional solder to soften and melt. Another object is to provide a power semiconductor device which comprises a highly reliable bonding joint and is low in power loss even when the device is operated at high frequency.

Means for Solving the Problem

A power semiconductor device operable under a temperature environment of 150° C. or greater, which power semiconductor device is characterized in that: it comprises a wide bandgap semiconductor device substrate, an electrode laminated on the wide bandgap semiconductor device substrate, and a connection terminal for connection to external wiring to be connected to the electrode; difference among the three coefficients of linear expansion of the electrode, a core of the connection terminal, and the semiconductor device substrate is $5.2 \times 10^{-6}$/K at maximum; and a joint joining the connection terminal and the electrode directly joins the connection terminal and the electrode.

The electrode and connection terminal of the semiconductor device are preferably joined by ultrasonic vibration. Further, the semiconductor device substrate is preferably silicon carbide, GaN or diamond. In addition, the electrode is preferably made of molybdenum, tungsten or a compound (or alloy) including of one or both thereof. Still further, the core of the connection terminal is preferably made of molybdenum, tungsten or a compound (or alloy) including of one or both thereof.

Further, the core of the connection terminal can be coated with a metal coating of an electrical resistivity of $4 \times 10^{-8}$ Ωm or less, but in this case, the coating area of the metal in the cross-section of the connection terminal having the metal coating is preferably 70% or less relative to the cross-section.

Effect of the Invention

According to the present invention, a power semiconductor device can be provided in which the semiconductor device electrode, connection terminal and semiconductor device substrate are conductively connected, and in which the bonding joint reduces the likelihood of cracking-destruction occurring owing to thermal cycle under a temperature environment enabling operation of a wide bandgap semiconductor, namely, of 150° C. or greater. A power semiconductor device of high reliability capable of high-temperature operation can therefore be provided. In addition, a power semiconductor device can be provided that has a bonding joint of high reliability and is low in power loss even when the device is operated at high frequency.

BRIEF DESCRIPTION OF THE DRAWINGS

FIG. 1 is a diagram showing a configuration according to a first embodiment of the present invention.

FIG. 2 is a diagram showing a configuration according to a second embodiment of the present invention.

MODES FOR CARRYING OUT THE INVENTION

As explained in detail in the following, the inventor of the present invention accomplished the present invention upon learning to define the difference in coefficient of linear expansion among the semiconductor electrode, core of the connection terminal, and semiconductor device substrate to a specific value so that the bonding joint of the connection terminal becomes stable and high in reliability even when exposed to high temperature.

This specification uses the terms "electrode laminated on the wide bandgap semiconductor device substrate" and "electrode," which in some cases refer to an electrode that is laminated on the wide bandgap semiconductor device substrate and that is an electrode directly joined to, or contacted with, a connection terminal.

The coefficient of linear expansion of the material constituting the semiconductor device is constant within a certain temperature range, and the linear expansion of the material constituting the semiconductor device is assumed to be proportional to the temperature. Based on this assumption, in the case where the difference in coefficient of linear expansion is made $5.2 \times 10^{-6}$/K, which is ¼ the difference in coefficient of linear expansion ($20.6 \times 10^{-6}$/K) between conventionally used silicon (coefficient of linear expansion: $2.4 \times 10^{-6}$/K) and aluminum (coefficient of linear expansion: $23 \times 10^{-6}$/K), the upper limit temperature can be increased up to 4 times the conventional upper limit temperature. In other words, by making the difference in coefficient of linear expansion $5.2 \times 10^{-6}$/K, which is ¼ the difference in coefficient of linear expansion between the coefficient of linear expansion of silicon and the coefficient of linear expansion of aluminum, the shearing force can be held to about the same level as the conventional shearing force even under a 600° C. temperature environment, which is about 4 times the upper limit temperature of 150° C. in a bonding joint between a silicon substrate and an aluminum wire. By establishing a combination that makes the difference in coefficient of linear expansion among the core of the connection terminal, the semiconductor device substrate, and the electrode member directly joined to the connection terminal $5.2 \times 10^{-6}$/K, it is possible to inhibit cracking-destruction of the bonding joint between the core of the connection terminal and the electrode, which is the place where heat-cycle-induced thermal stress tends to arise. As stated earlier, the temperature of 600° C. corresponds to an operable temperature of a wide bandgap semiconductor.

Therefore, by making the maximum value of the coefficient of linear expansion among the semiconductor device electrode, core of the connection terminal and semiconductor device substrate in a power semiconductor device $5.2 \times 10^{-6}$/K, an effect is exhibited of enabling reduction of cracking-destruction by the heat cycle to which the power semiconductor device is exposed, while stably maintaining the conductive connection of the connection terminal and the bonding joint. This effect is exhibited even under a temperature environment of 150° C. or greater that softens or melts solder. In addition, this effect is also exhibited under a temperature environment of a temperature higher than the melting point of a high-temperature solder, such as 200° C. or greater and 400° C. or greater. As stated above, this effect is exhibited even under a temperature environment of 600° C. at which a wide bandgap semiconductor can operate. In other words, an effect is exhibited of enabling reduction of cracking-destruction by the heat cycle to which the power semiconductor device is exposed, while stably maintaining the conductive connection of the connection terminal and the bonding joint, at least in the temperature range of 150° C. or greater to 600° C. or less.

Moreover, a smaller difference in the coefficient of linear expansion among the semiconductor device electrode, core of the connection terminal and semiconductor device substrate is more preferable. Most preferably, the difference in the coefficient of linear expansion among the semiconductor device electrode, core of the connection terminal and semiconductor device substrate is zero. However, when different types of materials are combined, it is hard to make the difference in the coefficient of linear expansion among the semiconductor device electrode, core of the connection terminal and semiconductor device substrate zero. Combinations of materials that can make the difference in the coefficient of linear expansion between the core of the connection terminal and semiconductor device substrate zero are therefore limited. On the other hand, selection of the material from a wide variety of materials becomes possible when the difference in coefficient of linear expansion with respect to the semiconductor device substrate is expanded to within $5.2 \times 10^{-6}$/K. The difference in coefficient of linear expansion among the semiconductor device electrode, core of the connection terminal and semiconductor device substrate is preferably within $1.5 \times 10^{-6}$/K. Further, the difference in coefficient of linear expansion between the core of the connection terminal and the electrode is preferably made to fall within $1.5 \times 10^{-6}$/K. Between the core of the connection terminal and the electrode is a location readily susceptible to the load from the heat cycle. It is noted that coefficient of linear expansion as termed in this specification is the value measured under conditions of 1 atm., 20° C.

In the power semiconductor device of the present invention, the connection between the connection terminal (wire) and the semiconductor device electrode is directly joined with no intermediate joining material like solder or filler material. Such joining methods include, for example, the ultrasonic wire bonding method that joins by applying ultrasonic vibration to the bonding region and the ball bonding method that joins by forming a molten ball at the tip of the wire by arc discharge. As these joining methods do not use a joining material like solder or filler material, there is no danger of a faulty connection occurring because of softening or melting of the joint material even at a high temperature of 150° C. or greater. The joining method using ultrasonic vibration enables bonding in a short time at normal temperature. It therefore also makes it possible to minimize the mechanical pressure exerted on the device and enables safe bonding, i.e., bonding that does not cause a faulty connection. Thus, formation of the bonding joint using ultrasonic vibration is preferable because it enables formation of a highly reliable bonding joint.

The material of the semiconductor device substrate used in the power semiconductor device of the present invention is a wide bandgap semiconductor material with a bandgap of 2.8 eV or greater. The material of the semiconductor device substrate is, for example, silicon carbide (SiC), gallium nitride (GaN), diamond, or aluminum gallium nitride (AlGaN). It is particularly preferable for the material of the semiconductor device to be silicon carbide (SiC), gallium nitride (GaN), or diamond. These materials are high in intrinsic range temperature of functioning as a semiconductor and capable of operating as semiconductor even under a high temperature environment of around 600° C.

In the power semiconductor device according to the present invention, it suffices for the core of the connection terminal and the electrode member which is directly joined to the connection terminal to be ones whereby the difference in coefficient of linear expansion among the three members, including the aforesaid semiconductor device substrate, is $5.2 \times 10^{-6}$/K or less. For example, the core of the connection terminal and the electrode member are molybdenum (coefficient of linear thermal expansion: $4.9 \times 10^{-6}$/K), tungsten (coefficient of thermal expansion: $4.3 \times 10^{-6}$/K), chromium (coefficient of linear thermal expansion: $6.2 \times 10^{-6}$/K), or alloys of these. When used in this specification, the term "alloy" means a solid solution or intermetallic compound containing two or more metal elements. Further, the term "metal alloy" means a metal solid solution or intermetallic compound that is predominantly metal. The term "predominantly metal" here means that the metal is contained at 50 mol % or greater. The core of the connection terminal and the electrode member are preferably molybdenum, tungsten or an alloy thereof. When these metals or alloys are used as the connection wire member, they can be finely fabricated by drawing. Further, when these metals or alloys are used as the electrode member, the electrode can be formed by sputtering or the like. Therefore, adoption of molybdenum, tungsten or an alloy thereof enables easy fabrication of both the core and the electrode and makes flexible device arrangement possible. Within the range that does not impair the action/effect exhibited by the present invention, the electrode can have interface layers at its interface with the connection terminal and its interface with the semiconductor device substrate. The interface layers are, for example, thin films formed by sputtering. The thickness of the interface layers is preferably a thickness of ⅕ or less the electrode thickness. It should be noted that in the present invention the connection terminal encompasses wires like the so-called bonding wire and members like the so-called bus bar that are joined to the electrode to have a given bonding area. Further, the coefficient of linear expansion of the electrode stipulated by the present invention means the coefficient of linear expansion of the electrode directly joined to the connection terminal.

Further, when the power semiconductor device of the present invention is used in a high-frequency circuit, the current flowing in the connection terminal is concentrated at the terminal surface owing to the skin effect. Therefore, loss is liable to increase in the case of a connection terminal made of molybdenum, tungsten or an alloy thereof, which are relatively high in electrical resistance. Loss is desirably held down by reducing components with high frequency resistance. Therefore, a connection terminal is preferably adopted that uses molybdenum, tungsten or an alloy thereof for the core and whose core is coated with a metal of lower resistance than the core. Such a metal coating can be formed by vapor deposition or plating, for example. Specific metal coating materials include gold, silver, copper, aluminum, and palladium. The material of the metal coating is preferably selected from among gold, silver and copper. This is because these metals are low in electrical resistivity. In addition, the thickness of the coating is desirably a thickness approximately the same as the skin depth at the frequency and ambient temperature of the high-frequency circuit in which the power semiconductor device is used. The skin depth L is calculated by the following Equation 1.

$$\text{Skin depth } L = \frac{1}{\sqrt{\pi \cdot f \cdot \mu \cdot \sigma}} \quad \text{(Eq. 1)}$$

Here, f is frequency (Hz), μ is permeability (H/m), and σ is conductivity (S/m), the reciprocal of electrical resistivity.

For example, near room temperature, the electrical resistivity of copper is about $1.7 \times 10^{-8}$ Ωm and permeability is about $4\pi \times 10^{-7}$ H/m. Here, considering that the relative permeability of copper is substantially 1, it was assumed that $\mu = \mu 0 = 4\pi \times 10^{-7}$ H/m. So when the frequency is 100 kHz, the skin depth calculated from Equation 1 is 0.2 mm. From this it follows that a circuit frequency of 100 kHz, a connection terminal with a copper coating of about 0.2 mm thickness is preferable. The frequency band in the vicinity of 100 Hz is a frequency band commonly used by high-frequency circuits, and corresponding electric circuit products are abundant. When the frequency is 100 kHz and a metal coating of an electrical resistivity of $4.0 \times 10^{-8}$ Ωm is used, the skin depth by Equation 1 is about 0.3 mm. The size of a connection terminal for wiring used in a power semiconductor device is generally a round wire of 1.2 mm diameter φ or less, or a bus bar of a thickness of 1.2 mm or less. When the thickness of the connection terminal is 1.2 mm, the total thickness of the coating in the thickness direction of the connection terminal becomes 0.6 mm (=0.3 mm×2), which is substantially the same as the core thickness. In addition, when the electrical resistivity of the metal coating exceeds $4.0 \times 10^{-8}$ Ωm, the coating may become larger than the thickness of the core. In this case, the effect on the coefficient of linear expansion of the bonding joint may possibly come to be dominated by the effect of coating component. It should be noted that coating metals with low electrical resistivity include silver and gold. The electrical resistivity of silver is $1.5 \times 10^{-8}$ Ωm, and the electrical resistivity of gold is $2.2 \times 10^{-8}$ Ωm.

Further, based on the explanation up to here, the area of the metal coating in the cross-section of the connection terminal should be an area that is 70% or less of the cross-sectional area of the connection terminal. Preferably, the area of the metal coating in the cross-section of the connection terminal is 40% or less of the cross-sectional area of the connection terminal. It should be noted that the connection terminal can of course utilize a discrete core made of molybdenum, tungsten, chromium, or alloys thereof, without forming a metal coating.

The formation of the metal coating on the surface of the core can be by any method insofar as the desired thickness can be formed. However, from the viewpoint of productivity, hot dip coating is preferable as the method for forming the metal coating on the surface of the core. When the device is used in a high-frequency region, current flows densely in the metal coating owing to the skin effect. Therefore, when the metal coating is formed of copper, use of a copper pyrophosphate bath is desirable. This is because a copper pyrophosphate bath is excellent in uniformity and the crystalline structure of the coating becomes compact. Further, it is preferable to first ablate the coating from the region of the connection terminal to be joined and carry out the ultrasonic bonding between the core and electrode thereafter. Especially in the case where the electrode is composed of molybdenum, tungsten or an alloy thereof, it is preferable when joining the connection terminal coated with the metal coating and the electrode to carry out the ultrasonic bonding between the core and the electrode after ablating the coating. However, in the case of a connection terminal having a thin coating on order of less than 20 μm, the coating removal step can be omitted. This is because the coating detaches or the coating fuses with surrounding members during the ultrasonic bonding.

In addition, when a silicon carbide substrate is used as the semiconductor device substrate and a schottky diode is to be configured, molybdenum or tungsten is used because both have schottky barriers. Conventionally, aluminum has been used for the electrode of a schottky diode formed on a silicon carbide substrate, and aluminum wire has been used for the connection terminal. However, use of the same metal for the schottky metal, electrode and connection terminal core enhances the linear expansion coefficient compatibility of the whole device and has the merit of enabling configuration of a power semiconductor device of higher reliability.

The present invention is concretely explained using the drawings in the following.

FIG. 1 is a diagram showing the configuration of a first embodiment of the present invention. A silicon carbide substrate (coefficient of linear expansion: $4.2 \times 10^{-6}$/K) designated by symbol 1 of FIG. 1 is 4H n-type. The silicon carbide substrate 1 is a 5 mm×5 mm square having a thickness of about 200 µm. A silicon carbide homoepitaxial layer designated by symbol 2 of FIG. 1 has a thickness of around 10 µm. A 1 µm thick molybdenum film (coefficient of linear expansion: $4.9 \times 10^{-6}$/K) 3 is formed on the epitaxial layer 2 by sputtering to form a schottky electrode. Further, symbol 4 of FIG. 1 is a 0.3 µm thick nickel film formed by sputtering. After the nickel film 4 has been formed, heat treatment is performed at 1000° C. for about 2 min to form an ohmic junction on the rear surface of the silicon carbide substrate (semiconductor device substrate) 1. In addition, molybdenum film metal (film) 5 is formed on rear surface of the nickel film 4 by sputtering to a thickness of about 2 µm.

A bus bar (connection terminal) 6 includes a 5 mm wide, 0.6 mm thick flat molybdenum core (coefficient of linear expansion: $4.9 \times 10^{-6}$/K) and the front and rear surfaces of the molybdenum core are each copper plated to a thickness of 0.2 mm. The bus bar 6 is joined to the molybdenum film 5 by ultrasonic bonding. The thickness of the copper plating is calculated by the aforesaid Equation 1 assuming a copper electrical resistivity of $1.7 \times 10^{-8}$ Ωm, permeability of about $4\pi \times 10^{-7}$ H/m, and an operating frequency of 100 kHz. When the bus bar 6 is bonded, a protective tape is attached to the molybdenum film 3 formed on one surface of the silicon carbide substrate 1. The silicon carbide substrate 1 is set on the pedestal of the ultrasonic bonding machine so that the molybdenum film 3 with attached protective tape faces the pedestal. Next, the bus bar is mounted on the surface of the molybdenum film 5, and a 3 mm diameter $\phi$ ultrasonic transducer is uniformly pressed onto the contact region surface of the bus bar to be bonded. The ultrasonic frequency used is 100 kHz and the amplitude is 1 µm. Note that prior to the ultrasonic bonding, the bonding region of the bus bar to be joined to the device electrode (molybdenum film 5) has the copper coating of the bus bar ablated with abrasive paper and the bonding surface put in a smooth condition.

Next a wire (connection terminal) 7 is joined to the molybdenum film 3. The wire 7 has a 0.6 mm diameter molybdenum core. The surface of the core is coated with copper to a thickness of 0.2 mm. After removal of the protective tape attached to the molybdenum film 3, ultrasonic bonding is performed on the bonding region 8 of the molybdenum film 3 and wire 7. The ultrasonic frequency is 100 kHz and the amplitude is 1 µm. Similarly to in the bonding of the bus bar, the ultrasonic bonding region of the wire 7 is abraded to remove the coating and the bonding surface put in a smooth condition.

A current of 120 A was passed in the forward direction of a schottky diode device fabricated by the aforesaid method. At a steady state current flow of 120 A, the surface temperature of the device observed with a radiation thermometer was 200° C. When the polarity of the applied voltage was reversed from this state, current flow was blocked. When forward voltage was restored, the same current flow as previously was ascertained. It can be seen from these observations that the diode operated normally even when the device temperature reached 150° C. or greater. In addition, DC current was alternately passed and blocked at 5 min intervals over 1000 h, 12,000 times, whereafter the joint regions formed on the front and rear surfaces of the device were observed with a microscope. No cracks or similar were found at the joint regions formed on the front and rear surfaces of the device.

In addition, in order to examine the high-frequency characteristics of the schottky diode device fabricated by the aforesaid method, the device was operated under conditions of a diode ON-OFF cycle of 100 kHz and conduction current of 120 A. The temperature of the device surface under these conditions was about 250° C. This temperature is about 50° C. higher than in DC operation. Furthermore, another device was fabricated within the scope of the present invention as modification of the first embodiment. The sizes of the molybdenum wire and bus bar connected to this device were the same as the sizes of the molybdenum wire and bus bar explained earlier. However, neither the molybdenum wire nor the bus bar connected to this device had a copper coating. The device was operated under ON-OFF conditions of 100 Hz/120 A. The steady state temperature was 280° C. This temperature is about 80° C. higher than in DC operation. The temperature increase of the earlier embodiment using a device having both the wire and the bus bar connected thereto coated with copper platings was about 30° C. less than the temperature increase in this example. From this, an effect by the copper plating of reducing AC loss, i.e., and effect of inhibiting apparent electrical resistance increase, could be ascertained.

Further, as a comparative example, a schottky diode device was fabricated that was the same as the first embodiment except that a wire 7 made of gold (coefficient of linear expansion: $14.3 \times 10^{-6}$/K) was used. The structure and assembly method of this schottky diode device were the same as those of the first embodiment. However, in this comparative example, the gold wire was not coated with copper because its electrical resistivity ($2.22 \times 10^{-8}$ Ωm) was sufficiently low. A current of 120 A was passed in the forward direction of the schottky diode device of this comparative example. The steady state surface temperature of the device observed with a radiation thermometer was 250° C. When the polarity of the applied voltage was reversed from this state, current flow was blocked. When forward voltage was restored, the same current flow as previously was ascertained. It can be seen from these observations that the diode operated normally even when the device temperature reached 150° C. or greater. In addition, a test was conducted in which DC current was to be alternately passed and blocked at 5 min intervals over 1000 h, 12,000 times. However, the device became incapable of passing current after about 1 h. The cause was then investigated by microscopic observation and other means. As a result, the cause was found to be joint detachment between the wire 7 and the electrode (molybdenum film 3), and it was concluded to be development of cracking-destruction owing to difference in coefficient of linear expansion between the wire 7 and the electrode.

FIG. 2 is a diagram showing the configuration of a second embodiment of the present invention. An n-type GaN substrate (coefficient of thermal expansion: $5.6 \times 10^{-6}$/K) designated by symbol 9 of FIG. 2 is the size of a 3 mm×3 mm square having a thickness of about 300 µm. The thickness of a GaN homoepitaxial layer (film) designated by symbol 10 of FIG. 2 is about 10 µm. A 0.2 µm thick palladium film (coefficient of linear expansion: $11.8 \times 10^{-6}$/K) 11 is formed on the epitaxial layer by sputtering to form a schottky electrode. On this is formed by sputtering a 2 µm thick tungsten electrode (coefficient of linear expansion: $4.3 \times 10^{-6}$/K) 12.

Further, symbol 13 of FIG. 2 is a titanium and gold multilayer film formed by sputtering to a thickness of 0.3 µm. After formation of the multilayer film 13, heat treatment is performed at 900° C. for about 30 sec to form an ohmic junction on the rear surface of the GaN substrate. In addition, a tungsten metal (film) 14 is formed on the surface of the multilayer film 13 by sputtering to a thickness of about 2 µm. Next, a bus bar 15 has a 3 mm wide, 0.6 mm thick flat tungsten core and the front and rear surfaces of the core are gold plated to a thickness of 0.25 mm. The bus bar 15 is joined to the tungsten film 14 by ultrasonic bonding. The thickness of the gold plating is calculated by the foregoing Equation 1 assuming a gold electrical resistivity of $2.4 \times 10^{-8}$ Ωm, permeability of about $4\pi \times 10^{-7}$ H/m, and an operating frequency of 100 kHz. When the bus bar is bonded, a protective tape is attached to the tungsten film 12 formed on one surface of the GaN substrate. The GaN substrate 9 is set on the pedestal of the ultrasonic bonding machine so that the tungsten film 14 with attached protective tape faces the pedestal. Then, the bus bar is mounted on the surface of the tungsten film 14, and a 3 mm diameter φ ultrasonic transducer is uniformly pressed onto the contact region surface of the bus bar to be bonded. The ultrasonic frequency used is 100 kHz and the amplitude is 1 μm. Note that prior to the ultrasonic bonding, the bonding region of the bus bar to be connected to the tungsten film 14 has the gold coating ablated with abrasive paper and the bonding surface put in a smooth condition.

Next a bus bar (connection terminal) 16 is joined to the tungsten film 14. Similarly to in the first embodiment, the bus bar 16 has a 0.6 mm diameter molybdenum core, and the surface of the core is coated with gold to a thickness of 0.25 mm. After removal of the protective tape attached to the tungsten film 12, ultrasonic bonding is performed on the bonding region 8 of the tungsten film 12 and bus bar 16. The ultrasonic frequency is 100 kHz and the amplitude is 1 μm. As with the rear surface bus bar, the ultrasonic bonding region of the bus bar 16 is abraded to remove the coating and the bonding surface put in a smooth condition.

A current of 150 A was passed in the forward direction of a schottky diode device fabricated by the aforesaid method. At a steady state current flow of 150 A, the surface temperature of the device observed with a radiation thermometer was 250° C. When the polarity of the applied voltage was reversed from this state, current flow was blocked. When forward voltage was restored, the same current flow as previously was ascertained. It can be seen from these observations that the diode operated normally even when the device temperature reached 150° C. or greater. In addition, DC current was alternately passed and blocked at 5 min intervals over 1000 h, 12,000 times, whereafter the joint regions formed on the front and rear surfaces of the device were observed with a microscope. No cracks or similar were found at the joint regions formed on the front and rear surfaces of the device.

In addition, in order to examine the high-frequency characteristics of a device fabricated by the aforesaid method, the device was operated under conditions of a diode ON-OFF cycle of 100 kHz and conduction current of 150 A. The temperature of the device surface under these conditions was about 300° C. This temperature is about 50° C. higher than in DC operation. Furthermore, another device was fabricated within the scope of the present invention as modification of the first embodiment. The sizes of bus bars connected to this device were the same as the sizes of the bus bars explained earlier. However, neither of the bus bars connected to this device had a gold plating. The device was operated under ON-OFF conditions of 100 Hz/150 A. The steady state temperature was 340° C. This temperature is about 90° C. higher than in DC operation. The temperature increase of the earlier embodiment using a device having both bus bars connected thereto plated with gold was about 40° C. less than the temperature increase in this example. From this, an effect by the copper plating of reducing AC loss, i.e., and effect of inhibiting apparent electrical resistance increase, could be ascertained.

Further, as a comparative example, a schottky diode device was fabricated that was the same as the second embodiment except that the bus bars 15 and 16 made of copper were used. The structure and assembly method of this schottky diode device were the same as those of the second embodiment. However, in this comparative example, the copper bus bars were not coated because their electrical resistivity ($1.7 \times 10^{-8}$ Ωm) were sufficiently low.

A current of 150 A was passed in the forward direction of the schottky diode device of this comparative example. The steady state surface temperature of the device observed with a radiation thermometer was 200° C. When the polarity of the applied voltage was reversed from this state, current flow was blocked. When forward voltage was restored, the same current flow as previously was ascertained. It can be seen from these observations that the diode operated normally even when the device temperature reached 150° C. or greater. In addition, a test was conducted in which DC current was to be alternately passed and blocked at 5 min intervals over 1000 h, 12,000 times. However, the device became incapable of passing current after about 30 min. The cause was then investigated by microscopic observation and other means. As a result, the cause was found to be joint detachment between the bus bars 15 and 16 and the electrodes (tungsten films 12 and 14), and it was concluded to be development of cracking-destruction owing to difference in coefficient of linear expansion between the bus bars 15, 16 and the electrodes.

In the embodiments explained so far, a silicon carbide substrate and a GaN substrate were used as the semiconductor device substrate. However, the present invention can also be applied to devices that use diamond or AlGaN as the semiconductor device substrate. Further, in the embodiments explained so far, molybdenum and tungsten were used for the connection terminals and electrodes. However, use of chromium or alloys composed chiefly of chromium for the connection terminals and electrodes is also possible insofar as the difference in coefficient of linear expansion among the connection terminals, electrodes and the semiconductor device substrate is within $5.2 \times 10^{-6}$/K. Further, the present invention can be applied irrespective of device structure not only to schottky diodes but also to MOSFETs, JFETs, MESFETs, PIN diodes, IGBTs, thyristors, and the like.

EXPLANATION OF REFERENCE SYMBOLS

1 Silicon carbide substrate
2 Epitaxial layer
3 Molybdenum film
4 Nickel film
5 Molybdenum film
6 Bus bar
7 Connection terminal
8 Bonding region
9 GaN substrate
10 Epitaxial layer
11 Palladium film
12 Tungsten film
13 Titanium-gold multilayer film
14 Tungsten film
15 Bus bar
16 Bus bar

The invention claimed is:
1. A power semiconductor device operable under a temperature environment of 150° C. or greater, the power semiconductor device comprising:
a wide bandgap semiconductor device substrate;
an electrode laminated on the wide bandgap semiconductor device substrate; and
a connection terminal for connection to external wiring to be connected to the electrode;

wherein a difference among the three coefficients of linear expansion of the electrode, a core of the connection terminal, and the semiconductor device substrate is $5.2 \times 10^{-6}$/K at a maximum, and a joint joining the connection terminal and the electrode directly joins the connection terminal and the electrode.

2. The power semiconductor device as set out in claim 1, wherein the core of the connection terminal is composed of molybdenum, tungsten, or an alloy thereof.

3. The power semiconductor device as set out in claim 2, wherein the connection terminal is formed by coating the surface of the core with a metal whose electrical resistivity is $4 \times 10^{-8}$ Ω·m or less.

4. The power semiconductor device as set out in claim 3, wherein the area of the metal coating in a cross-section of the connection terminal is 70% or less with respect to said cross-section.

5. The power semiconductor device as set out in any one of claims 1 to 4, wherein the semiconductor device substrate is composed of silicon carbide, gallium nitride or diamond.

6. The power semiconductor device as set out in any one of claims 1 to 4, wherein the joint joining the electrode and the connection terminal is a joint joined by ultrasonic vibration.

7. The power semiconductor device as set out in any one of claims 1 to 4, wherein the electrode is composed of molybdenum, tungsten, or an alloy thereof.

* * * * *